(12) United States Patent  
Anzue et al.

(10) Patent No.: US 8,093,685 B2  
(45) Date of Patent: Jan. 10, 2012

(54) NITRIDE COMPOUND SEMICONDUCTOR ELEMENT

(75) Inventors: Naomi Anzue, Osaka (JP); Toshiya Yokogawa, Nara (JP); Yoshiaki Hasegawa, Shiga (JP)

(73) Assignee: Panasonic Corporation, Osaka (JP)

( * ) Notice: Subject to any disclaimer, the term of this patent is extended or adjusted under 35 U.S.C. 154(b) by 854 days.

(21) Appl. No.: 11/568,481

(22) PCT Filed: Oct. 13, 2005

(86) PCT No.: PCT/JP2005/018881  
§ 371 (c)(1),  
(2), (4) Date: Oct. 30, 2006

(87) PCT Pub. No.: WO2006/041134  
PCT Pub. Date: Apr. 20, 2006

(65) Prior Publication Data  
US 2008/0042244 A1 Feb. 21, 2008

(30) Foreign Application Priority Data  
Oct. 15, 2004 (JP) ................................. 2004-300907

(51) Int. Cl.  
*H01L 29/20* (2006.01)

(52) U.S. Cl. ............ 257/615; 257/94; 257/98; 257/103; 257/613; 257/E33.023; 257/E33.025; 257/E33.027; 257/E33.028; 257/E33.03; 257/E33.033; 257/E33.069; 257/E33.034; 257/E33.055; 257/E33.072

(58) Field of Classification Search ........... 257/E33.025, 257/E33.028, E33.03, E33.033, E33.034, 257/E33.069, 94, 98, 103, 613, 615, E33.023, 257/E33.027, E33.055, E33.072  
See application file for complete search history.

(56) References Cited

U.S. PATENT DOCUMENTS

| 5,604,763 | A | 2/1997 | Kato et al. |
|---|---|---|---|
| 2002/0063258 | A1* | 5/2002 | Motoki ........................... 257/95 |
| 2003/0020087 | A1 | 1/2003 | Goto et al. |
| 2003/0227026 | A1 | 12/2003 | Goto et al. |
| 2004/0067648 | A1* | 4/2004 | Morita et al. ................. 438/689 |
| 2005/0003572 | A1* | 1/2005 | Hahn et al. ...................... 438/47 |
| 2006/0166478 | A1 | 7/2006 | Sugahara et al. |

FOREIGN PATENT DOCUMENTS

| JP | 10-125958 | 5/1998 |
|---|---|---|
| JP | 10-242570 | 9/1998 |

(Continued)

OTHER PUBLICATIONS

International Search Report for corresponding Application No. PCT/JP2005/018881 mailed Jan. 17, 2006.

(Continued)

*Primary Examiner* — Jay C Kim  
(74) *Attorney, Agent, or Firm* — Renner, Otto, Boisselle & Sklar, LLP

(57) ABSTRACT

A nitride compound semiconductor element according to the present invention is a nitride compound semiconductor element including a substrate 1 having an upper face and a lower face and a semiconductor multilayer structure 40 supported by the upper face of the substrate 1, such that the substrate 1 and the semiconductor multilayer structure 40 have at least two cleavage planes. At least one cleavage inducing member 3 which is in contact with either one of the two cleavage planes is provided, and a size of the cleavage inducing member 3 along a direction parallel to the cleavage plane is smaller than a size of the upper face of the substrate 1 along the direction parallel to the cleavage plane.

10 Claims, 14 Drawing Sheets

FOREIGN PATENT DOCUMENTS

| | | |
|---|---|---|
| JP | 11-195813 | 7/1999 |
| JP | 2000-040856 | 2/2000 |
| JP | 2000-058972 | 2/2000 |
| JP | 2000-174334 | 6/2000 |
| JP | 2003-008143 | 1/2003 |
| JP | 2003-051636 | 2/2003 |
| JP | 2003-163375 | 6/2003 |
| JP | 2003-234546 | 8/2003 |
| JP | 2003-282543 | 10/2003 |
| JP | 2004-288876 | 10/2004 |
| WO | 2004/086579 | 10/2004 |

OTHER PUBLICATIONS

Form PCT/ISA/237 for International Application No. PCT/JP2005/018881 and concise explanation.

Office Action and English translation thereof for corresponding Chinese Application No. 200580011771.X dated Nov. 23, 2007.

* cited by examiner

NITRIDE COMPOUND SEMICONDUCTOR ELEMENT

TECHNICAL FIELD

The present invention relates to a nitride compound semiconductor element and a production method therefor.

BACKGROUND ART

A band gap of a nitride compound semiconductor whose composition is expressed by the general formula $In_xGa_yAl_zN$ (where $x+y+z=1$, $0 \leq x \leq 1$, $0 \leq y \leq 1$, $0 \leq z \leq 1$) may have a width corresponding to blue light or ultraviolet light through adjustment of the mole fraction of each element. Therefore, there have been vigorous research activities directed to light-emitting devices, e.g., semiconductor lasers, that comprise a nitride compound semiconductor as an active layer.

FIG. 1 shows the crystal structure of a nitride compound semiconductor. As shown in FIG. 1, a nitride compound semiconductor has a crystal structure of a hexagonal-system. Therefore, when fabricating a semiconductor laser which is constructed so that its upper face (principal face) is the (0001) plane and its resonator end faces are the M-plane (1-100), cleavage is likely to occur not along an A-plane which is perpendicular to these planes, but along a crystal plane which is tilted by 30° from the A-plane. As a result, there is a problem in that, not only when performing cleavage along the A-plane, but also when forming cleavage along the M-planes (1-100) to form the resonator end faces, cracks are likely to occur in a direction which is tilted by 60° from the M-plane (1-100).

Due to this problem, it has conventionally been very difficult to fabricate a nitride compound semiconductor element having smooth resonator end faces.

Note that a sapphire substrate, which has conventionally been widely used as a substrate for nitride compound semiconductor elements, is not capable of cleaving. Therefore, when forming a semiconductor laser having a sapphire substrate, it has been practiced to perform scribing along the M-plane from the side of a nitride compound semiconductor layer that is grown on a sapphire substrate to thus form a scratch in the nitride compound semiconductor layer, this being an attempt to facilitate the formation of a cleavage plane.

Patent Document 1 discloses a method which involves performing an edge scribing for a nitride compound semiconductor layer, and thereafter performing a cleavage through breaking.

[Patent Document 1] Japanese Laid-Open Patent Publication No. 2000-058972

DISCLOSURE OF INVENTION

Problems to be Solved by the Invention

However, according to the aforementioned conventional technique, since scratches are formed in the nitride compound semiconductor layer through scribing or dicing, there is a problem in that "burrs", "chipping", "end-face cracks" and the like are likely to occur, thus resulting in a reduced production yield. There is also a problem in that, since the active layer is likely to suffer from strain and crystal defects, scratches and ruggednesses may occur in a resonator end face (light-outgoing surface), thus deteriorating the optical characteristics and reliability.

Furthermore, when a lateral crystal growth layer with a reduced defect density is formed on a substrate, the substrate may not be reached by a scratch even if an edge scribing is performed from the nitride compound semiconductor layer side. Moreover, an air gap and an insulative film layer which exist between the lateral crystal growth layer and the substrate are fragile regions with a low mechanical strength, and therefore are likely to experience crystal peeling and may be damaged. Therefore, especially in the case of growing a lateral crystal growth layer on a substrate, it has been difficult with the conventional method to obtain good resonator surfaces.

The present invention has been made in order to solve the aforementioned problems, and a main objective thereof is to provide a nitride compound semiconductor element which allows cleavage to be performed with a good yield, and a production method therefore.

Means for Solving the Problems

A nitride compound semiconductor element according to the present invention is a nitride compound semiconductor element including a substrate having an upper face and a lower face and a semiconductor multilayer structure supported by the upper face of the substrate, such that the substrate and the semiconductor multilayer structure have at least two cleavage planes, comprising: at least one cleavage inducing member which is in contact with either one of the two cleavage planes, wherein a size of the cleavage inducing member along a direction parallel to the cleavage plane is smaller than a size of the upper face of the substrate along the direction parallel to the cleavage plane.

In a preferred embodiment, the upper face of the substrate has a rectangular shape, and the cleavage member is positioned in at least one of four corners of the upper face of the substrate.

In a preferred embodiment, the semiconductor multilayer structure has a laser resonator structure in which the cleavage planes function as resonator end faces; and a size of the cleavage inducing member along a resonator length direction is half or less of the resonator length.

In a preferred embodiment, the cleavage inducing member is smaller than a 180 μm×50 μm rectangle.

In a preferred embodiment, two or more cleavage inducing members are comprised, and arranged along a resonator length direction; and an interval between adjoining cleavage inducing members along the resonator length direction is 80% or more of the resonator length.

In a preferred embodiment, the cleavage inducing member is composed of a mask layer which is formed on the upper face of the substrate or in the semiconductor multilayer structure.

In a preferred embodiment, the cleavage inducing member is composed of a gap which is formed in the semiconductor multilayer structure.

In a preferred embodiment, a trench is formed on the upper face of the substrate; and the mask layer is positioned above the trench.

In a preferred embodiment, the mask layer is composed of a material which suppresses crystal growth of semiconductor layers composing the semiconductor multilayer structure.

In a preferred embodiment, the mask layer is formed of at least one material selected from the group consisting of: an oxide or nitride of silicon, aluminum, titanium, niobium, zirconia, or tantalum; gold; platinum; aluminum; nickel; palladium; and titanium.

In a preferred embodiment, the cleavage inducing members are located on both sides of a laser optical waveguide portion in the semiconductor multilayer structure.

In a preferred embodiment, the semiconductor multilayer structure includes: an n-type nitride compound semiconductor layer and a p-type nitride compound semiconductor layer; and an active layer interposed between the n-type nitride compound semiconductor layer and the p-type nitride compound semiconductor layer.

In a preferred embodiment, the substrate is a nitride compound semiconductor.

In a preferred embodiment, a pair of electrodes are formed on the upper face and the lower face of the substrate.

A production method for a nitride compound semiconductor element according to the present invention is a production method for a nitride compound semiconductor element including a substrate having an upper face and a lower face and a semiconductor multilayer structure supported by the upper face of the substrate, comprising: a step of providing a wafer to be split into the substrate; a step of growing semiconductor layers composing the semiconductor multilayer structure on the wafer; and a step of performing cleavage of the wafer and the semiconductor multilayer structure to form a cleavage plane of the semiconductor multilayer structure, further comprising a step of arranging a plurality of cleavage inducing members at positions where the cleavage plane is to be formed.

In a preferred embodiment, the step of arranging the cleavage inducing members includes: a step of depositing an insulative film; and a step of patterning the insulative film to form a plurality of mask layers being arranged along a line and defining positions at which the resonator end faces are to be formed.

In a preferred embodiment, the mask layers are formed on a principal face of the wafer.

In a preferred embodiment, the mask layers are formed in the semiconductor multilayer structure.

Effects of the Invention

According to the present invention, since cleavage is induced along a cleavage inducing member, the problem of cracks being likely to occur in a 60° direction with respect to the M-plane in relation to cleavage of a hexagonal-system nitride compound semiconductor is solved, thus facilitating the formation of smooth resonator end faces.

Moreover, according to the present invention, burrs, chipping, scratches and ruggednesses in the resonator end faces, strain in the active layer, formation of crystal defects and the like, which are likely to occur upon cleavage, are suppressed. Therefore, there is provided an effect that the optical characteristics and electrical characteristics of the finally-obtained semiconductor laser are improved.

DESCRIPTION OF THE REFERENCE NUMERALS

| | |
|---|---|
| 1 | wafer |
| 3 | cleavage inducing member (mask layer) |
| 18 | optical waveguide |
| 23 | p-side wiring |
| 24 | n-side wiring |
| 27 | trench |
| 30 | high defect-density region |
| 40 | semiconductor multilayer structure |

BEST MODE FOR CARRYING OUT THE INVENTION

A nitride compound semiconductor element according to the present invention includes a substrate having an upper face and a lower face, and a semiconductor multilayer structure which is supported by the upper face of the substrate, such that the substrate and the semiconductor multilayer structure have at least two cleavage planes.

In the present invention, "cleavage inducing members" are provided in order to facilitate "cleavage" of a crystal during its production steps. Therefore, in most of the semiconductor elements that are finally fabricated, (at least a portion of) a cleavage inducing member(s) exists. Each cleavage inducing member in each semiconductor element is in contact with either one of two cleavage planes. In other words, the cleavage inducing member according to the present invention is not sized so as to extend from one of two parallel cleavage planes to the other. The size of the cleavage inducing member along a direction parallel to a cleavage plane is smaller than the size of an upper face of the substrate along the direction parallel to the cleavage plane. In other words, the cleavage inducing member according to the present invention is sized so as to be in contact with a portion of a cleavage plane, and does not extend from end to end on the cleavage plane along the lateral direction.

Hereinafter, with reference to the drawings, a first embodiment of the nitride compound semiconductor element according to the present invention will be described. The nitride compound semiconductor element according to the present invention is preferably a semiconductor laser whose cleavage planes are utilized as resonator end faces, but may be any other light-emitting device, e.g., an LED (Light Emitting Diode), or a transistor. Although a semiconductor element other than a semiconductor laser does not utilize its cleavage planes as resonator end faces, the ability to separate a hard nitride compound into chips with a good yield through cleavage produces advantages such as facilitated production.

Embodiment 1

First, with reference to FIG. 2(a) to FIG. 2(e), a production method for the nitride compound semiconductor laser according to the present embodiment will be described. FIG. 2(a) to FIG. 2(e) are partial cross-sectional views during important steps. In actuality, the illustrated portion is merely a part of a wafer which is sized with a diameter of about 50 mm.

Figure 1:
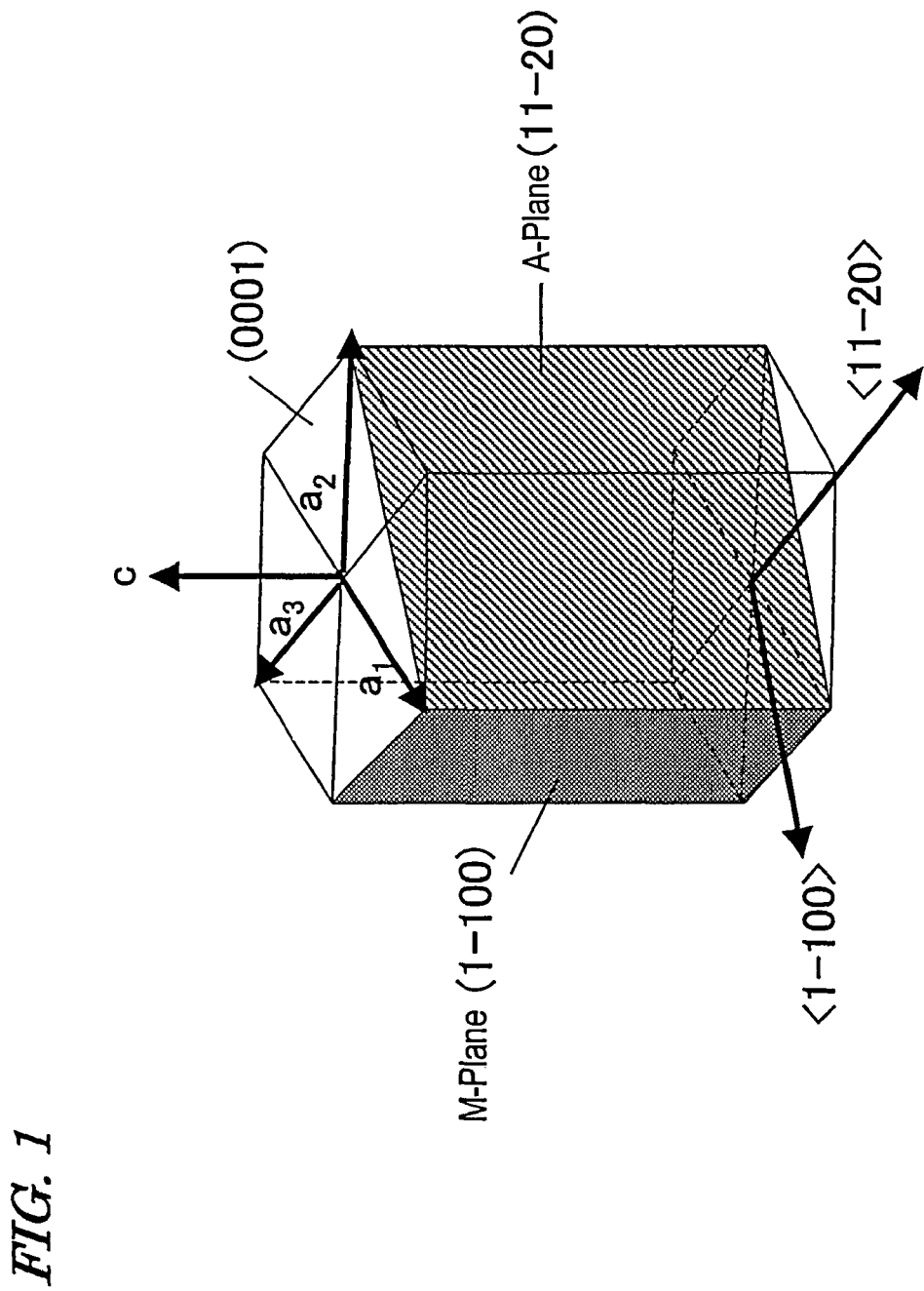
FIG. 1 A perspective view showing crystal plane orientations of a nitride compound semiconductor.
Figure 2:
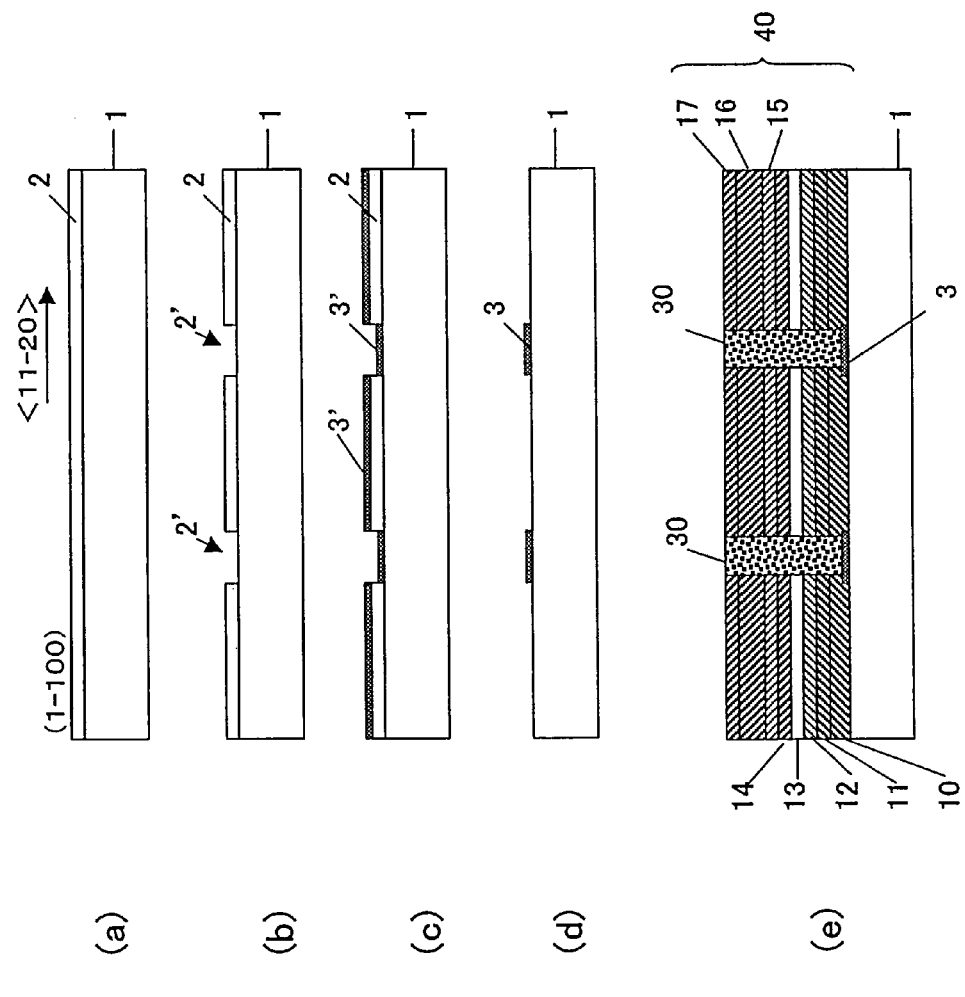
FIG. 2(a) to (e) are step-by-step cross-sectional views showing formation of mask layers according to Embodiment 1 of the present invention and a production method for a nitride compound semiconductor multilayer structure 40.

As shown in FIG. 2(a), a GaN wafer 1 whose upper face is the (0001) plane is provided, and a photoresist film 2 is applied on the upper face of the GaN wafer 1. Note that the cross section of the GaN wafer 1 that is shown in FIG. 2(a) to FIG. 2(d) is the M(1-100) plane, which will be exposed through primary cleavage. The <11-20> direction lies in the plane of the figure, and is parallel to the upper face (0001) of the GaN wafer 1.

By subjecting the photoresist film 2 to exposure and development through a known photolithography step, the photoresist film 2 is patterned as shown in FIG. 2(b). The patterned photoresist film 2 has a plurality of openings 2' which are periodically arranged in row and column directions. The shapes, sizes, and positions of the openings 2' can be arbitrarily set by changing the design of a photomask which is used for the exposure in a photolithography step. In the present embodiment, the location of the openings 2' is determined so as to define the "cleavage inducing members 3" shown in FIG. 4. The details of the construction shown in FIG. 4 will be described later.

Next, as shown in FIG. 2(c), a silicon dioxide ($SiO_2$) film 3' is deposited on the photoresist mask 2. Although the silicon dioxide film 3' is mostly positioned on the photoresist mask 2, some portions thereof are in contact with the upper face of the GaN wafer 1 through the openings 2'. Deposition of the silicon dioxide film 3' may be performed by an ECR sputtering technique, for example. Thereafter, a lift-off is performed by removing the photoresist film 2 with an organic solution such as acetone, thus forming the cleavage inducing member 3 of silicon dioxide as shown in FIG. 2(d).

Next, a multilayer structure 40 of nitride compound semiconductor is formed on the GaN wafer 1 having the plurality of cleavage inducing members 3 periodically arranged on its upper face. In the present embodiment, a metal-organic vapor phase epitaxy (MOVPE) technique is used to grow layers of nitride compound semiconductor expressed as $In_xGa_yAl_zN$ (where x+y+z=1, $0 \leq x \leq 1$, $0 \leq y \leq 1$, $0 \leq z \leq 1$). Specifically, the semiconductor multilayer structure 40 as shown in FIG. 2(e) is formed on the GaN wafer 1.

Hereinafter, with reference to FIG. 2(e), production steps of the semiconductor multilayer structure 40 of the present embodiment will be described.

First, the GaN wafer 1 having the cleavage inducing members 3 formed on its upper face is retained on a susceptor in a reactor of MOVPE equipment. Then, the reactor is heated to about 1000° C., and source gases, i.e., trimethylgallium (TMG) supplied in an amount of 7 sccm and ammonia ($NH_3$) gas supplied in an amount of 7.5 slm, and a carrier gas of hydrogen are simultaneously supplied, and silane ($SiH_4$) gas is supplied as an n-type dopant, thus allowing an n-type GaN layer 10 having a thickness of about 1 μm and an Si impurity concentration of about $1 \times 10^{18}$ $cm^{-3}$ to grow.

At this time, no growth of n-type GaN crystal directly occurs in the regions of the upper face of the GaN wafer 1 that are covered by the cleavage inducing members 3. However, the n-type GaN which has grown from the regions of the upper face of the GaN wafer 1 that are not covered by the cleavage inducing members 3 grows across the surface of the cleavage inducing members 3 in the lateral direction. Therefore, the surface of the cleavage inducing members 3 is also covered by the n-type GaN layer 10.

Thereafter, while also supplying trimethylaluminum (TMA), an n-type cladding layer 11 composed of n-type $Al_{0.05}Ga_{0.95}N$ with a thickness of about 1.5 μm and an Si impurity concentration of about $5 \times 10^{17}$ $cm^{-3}$ is grown. Then, after growing a first optical guide layer 12 composed of n-type GaN with a thickness of about 120 nm and an Si impurity concentration of about $1 \times 10^{18}$ $cm^{-3}$, the temperature is lowered to about 800° C., the carrier gas is switched from hydrogen to nitrogen, and trimethylindium (TMI) and TMG are supplied, thus growing quantum wells (three layers) composed of $In_{0.1}Ga_{0.9}N$ with a film thickness of about 3 nm and a multi-quantum well active layer 13 composed of $In_{0.02}Ga_{0.98}N$ barrier layers (two layers) with a film thickness of about 9 nm.

The temperature within the reactor is again elevated to about 1000° C., the carrier gas is switched back from nitrogen to hydrogen, and while supplying a p-type dopant of biscyclopentadienylmagnesium ($Cp_2Mg$) gas, a capping layer 14 composed of p-type $Al_{0.15}Ga_{0.85}N$ with a film thickness of about 10 nm and an Mg impurity concentration of about $5 \times 10^{17}$ $cm^{-3}$ is grown.

Next, a second optical guide layer 15 composed of p-type GaN with a thickness of about 120 nm and an Mg impurity concentration of about $1 \times 10^{18}$ $cm^{-3}$ is grown. Thereafter, a p-type cladding layer 16 composed of p-type $Al_{0.05}Ga_{0.95}N$ with a thickness of about 0.5 μm and an impurity concentration of about $5 \times 10^{17}$ $cm^{-3}$ is grown. Finally, a p-type contact layer 17 composed of p-type GaN with a thickness of about 0.1 μm and an Mg impurity concentration of about $1 \times 10^{18}$ $cm^{-3}$ is grown.

Figure 3:
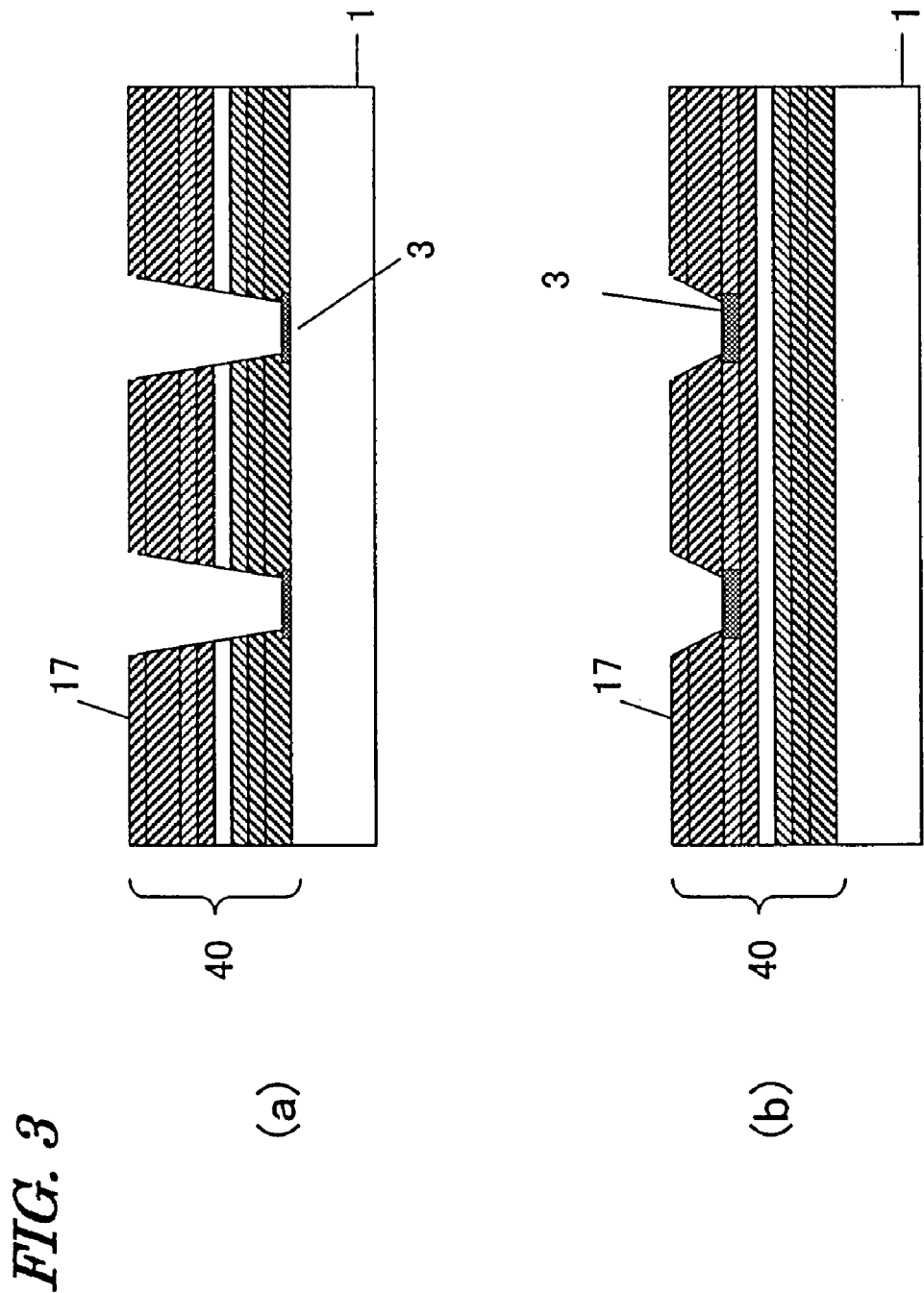
FIGS. 3(a) and (b) are cross-sectional views showing a relationship between mask layers according to Embodiment 1 of the present invention and the nitride compound semiconductor multilayer structure 40.

Note that, by adjusting the crystal growth conditions for the n-type GaN layer 10 and other semiconductor layers, it may be possible to leave the surface of the cleavage inducing members 3 exposed, rather than being completely covered. FIG. 3(a) shows a semiconductor multilayer structure 40 which is formed under conditions such that no crystal growth occurs on the cleavage inducing members 3.

Although FIG. 2(e) illustrates the n-type GaN layer 10 as having a flat upper face, it is usually the case that ruggednesses are formed on the upper face of the n-type GaN layer 10 in accordance with the presence/absence of the cleavage inducing members 3. In extreme cases, as described above, the n-type GaN layer 10 may locally have a zero thickness above the cleavage inducing members 3. Moreover, it would also be possible to form the n-type GaN layer 10 on the cleavage inducing members 3 so as to have a thickness substantially equal to the thickness of its portions in the other regions.

In the example shown in FIG. 2(e), portions 30 (hereinafter referred to as "high defect-concentration regions") of the semiconductor multilayer structure 40 that are positioned immediately above the cleavage inducing members 3 have a relatively deteriorated crystallinity. Thus, due to the presence of the cleavage inducing members 3 and the high defect-concentration regions 30, there is local stress occurring in the semiconductor multilayer structure 40 which has grown on the GaN wafer 1. It is considered that such local large stress, occurring in lines, makes it easy to induce cleavage in predetermined directions.

The cleavage inducing members 3 do not need to be formed directly on the upper face of the wafer 1, but may be formed on any layer among the semiconductor layers 10 to 16 shown in FIG. 2(e). FIG. 3(b) schematically shows an example where the cleavage inducing members 3 are located within the semiconductor multilayer structure 40.

Thus, according to the present embodiment, periodic strain can be generated in the semiconductor multilayer structure 40 because of the arrangement of the cleavage inducing members 3. However, if the thickness of the cleavage inducing members 3 is too large, the active layer may also have a large strain due to their influence. In order to ensure that such strain does not become too large, the thickness of the cleavage inducing member 3 may be reduced to 0.5 μm or less.

However, depending on the shapes and positions of the cleavage inducing members 3, their thickness may be set to a value exceeding 0.5 μm. In particular, as shown in FIGS. 3(a) and (b), in the case where the cleavage inducing members 3 are not covered by semiconductor but instead appear exposed when seen from above the semiconductor multilayer structure 40, the thickness of the cleavage inducing members 3 may be arbitrary.

Hereinafter, with reference to FIG. 4, the construction of the cleavage inducing members 3 will be specifically described.

The cleavage inducing members 3 according to the present embodiment are periodically arranged along the <11-20> direction, in a manner not to intersect any optical waveguide forming regions 18' which are formed in the semiconductor multilayer structure 40. The distance between two adjoining cleavage inducing members 3 along the <11-20> direction is set to be substantially the same value as the size along the <11-20> direction of the finally-obtained laser device. In the present embodiment, the size along the <11-20> direction of each laser device is about 400 μm, and therefore the arraying pitch of the cleavage inducing members 3 along the <11-20> direction is also set at 400 μm.

On the other hand, the arraying pitch of the cleavage inducing members 3 along the <1-100> direction is set at a value which is equal to the resonator length of each laser device. In the present embodiment, the resonator length is about 600 μm, and therefore the arraying pitch of the cleavage inducing members 3 along the <1-100> direction is also set at about 600 μm.

The planar shape of each cleavage inducing member 3 is square (size: 10 μm×10 μm), for example. Thus, by arranging, along lines 25 and lines 26 on the wafer 1, the cleavage inducing members 3 which are sufficiently small relative to the size of each laser device, it becomes possible to perform primary and secondary cleavages at accurate positions. The cleavage inducing members 3 only need to be arranged in positions where cleavage is to be induced (i.e., the lines 25 and lines 26), and they do not need to be arranged with a constant period. However, since they are preferably located so as to avoid the optical waveguide forming regions 18', it is preferable to place them in a periodical arrangement.

Since the primary cleavage is to take place along the <11-20> direction so as to expose the (1-100) plane as a cleavage plane, it is preferable that the size of the cleavage inducing members 3 along the <1-100> direction is sufficiently small relative to the resonator length. The reason is that, if the size of the cleavage inducing members 3 along the <1-100> direction is too large, it becomes difficult to define the position (position along the <1-100> direction) of the cleavage plane. Therefore, the size of the cleavage inducing members 3 along the <1-100> direction should be half or less of the resonator length, and is preferably 20% or less of the resonator length. The absolute value of this size is preferably 150 μm or less, and more preferably 50 μm or less.

On the other hand, the size of the cleavage inducing members 3 along the <11-20> direction may be relatively larger than its size along the <1-100> direction. The size of the cleavage inducing members 3 along the <11-20> direction is to be determined from the standpoint of ensuring cleavage inducing effects while also reducing the strain occurring in the optical waveguide and the defect density. Therefore, it is preferable that the size of the cleavage inducing members 3 along the <11-20> direction is 5 μm or more, and is smaller than a value obtained by subtracting the width of the waveguide (i.e., size along the <11-20> direction) from the size along the <11-20> direction of the laser device. The typical size of the cleavage inducing members 3 along the <11-20> direction is no less than 5 μm and no more than 180 μm.

Figure 5:
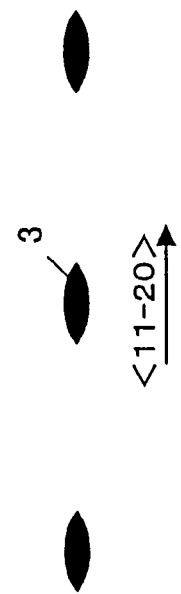
FIG. 5 A plan view showing the shape of mask layers according to Embodiment 1 of the present invention.

FIG. 5 shows a preferable example of the planar shape of the cleavage inducing members 3. As shown in FIG. 5, when each cleavage inducing member 3 has a longitudinal axis along the <11-20> direction, with its both ends being pointed so as to constitute acute angles, it is easy to suppress occurrence of cracks along a direction which is deviated by 60° from the <11-20> direction. Note that the shapes and locations of the cleavage inducing members 3 are not to be limited to the above example.

Figure 4:
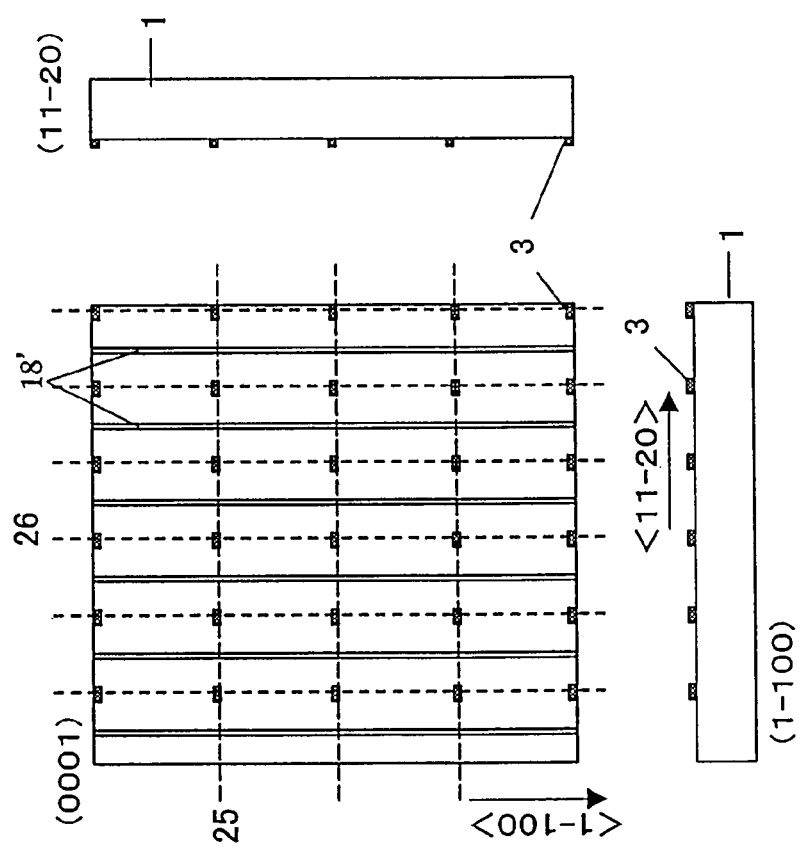
FIG. 4 A schematic diagram showing a wafer on which mask layers according to Embodiment 1 of the present invention are periodically arranged.

Note that each line 25 shown in FIG. 4 is defined by a row of plural cleavage inducing members 3 which are arranged along the <11-20> direction, and primary cleavage is to take place along these lines 25. Therefore, it is preferable to set the arraying pitch of the cleavage inducing members 3 along the <1-100> direction to be equal to the resonator length, but the arraying pitch of the cleavage inducing members 3 along the <11-20> direction is not constrained by the size of the laser device. In other words, so long as the cleavage inducing members 3 are on the lines 25 and located in regions other than the optical waveguide forming regions 18', they do not need to be arranged along the <11-20> direction with a constant period, as described above.

Figure 6:
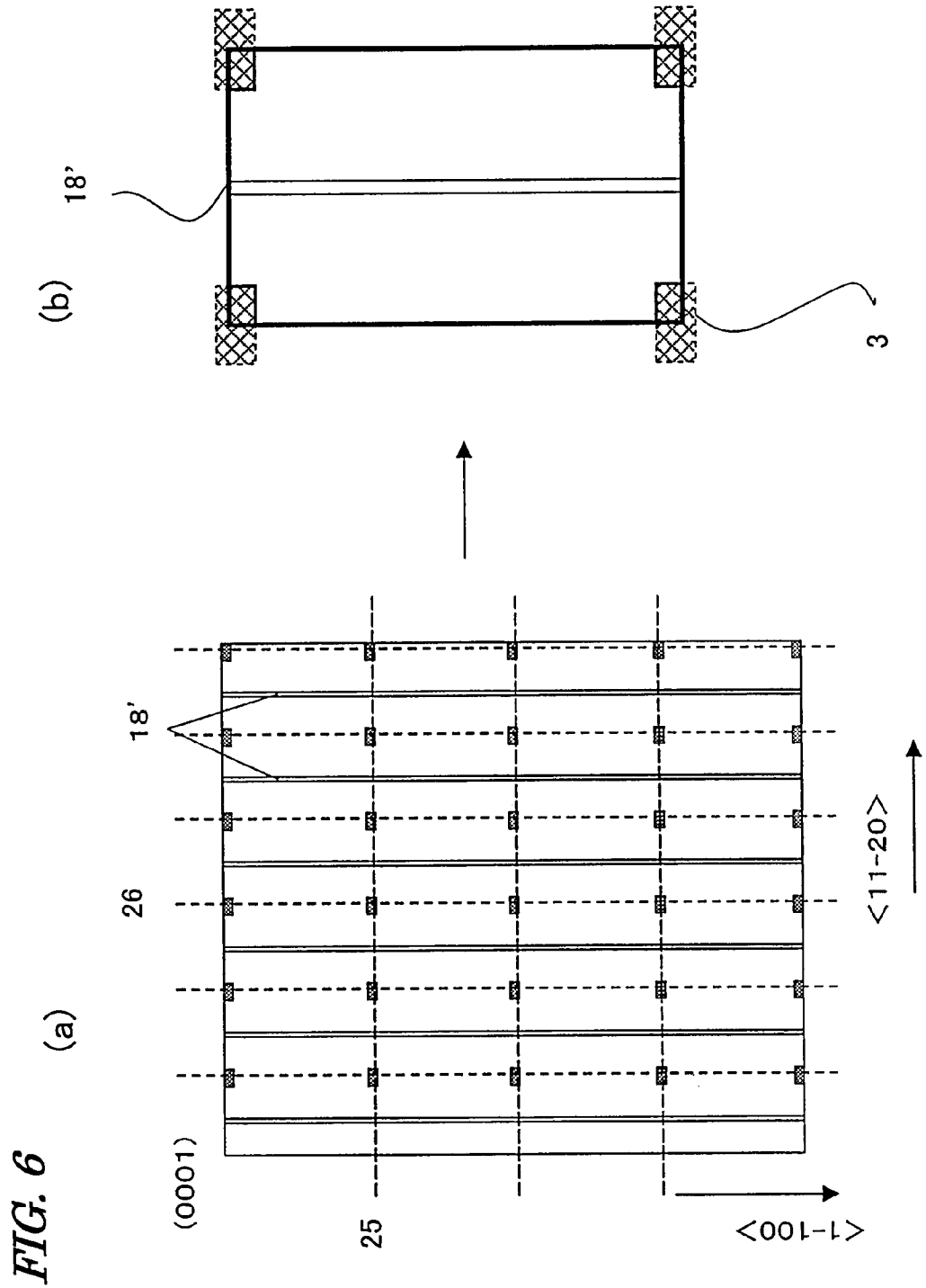
FIG. 6(a) is a plan view showing a wafer on which mask layers according to Embodiment 1 of the present invention are periodically arranged; and (b) is a plan view showing a split semiconductor laser.

FIG. 6 schematically shows the construction of chips to be split from a wafer through primary cleavage and secondary cleavage. FIG. 6(a) shows a state before the split, whereas FIG. 6(b) shows one of the individual split-chips.

In the example shown in FIG. 6(b), cleavage is occurring at a position traversing the cleavage inducing members 3. However, the cleavage plane does not need to traverse the cleavage inducing members 3, but may instead be formed near the cleavage inducing members 3. As shown in FIG. 6(b), if primary and secondary cleavages occur so as to traverse the cleavage inducing members 3, each finally-obtained semiconductor laser chip will include four broken pieces of cleavage inducing members 3 at its four corners. However, it is not necessary for each semiconductor laser to contain four broken pieces of cleavage inducing members 3 at its four corners. Depending on the cleavage position, the number of (broken pieces or whole) cleavage inducing members 3 to be contained in each semiconductor laser may fluctuate. In extreme cases, a given semiconductor laser may finally contain no cleavage inducing member 3 at all. In such cases, a semiconductor laser adjoining that semiconductor laser may contain at least one cleavage inducing member 3 which has been left unbroken.

The material of the cleavage inducing members 3 is not limited to $SiO_2$, but may be an insulator such as silicon nitride. Preferably, they are formed of at least one material selected from the group consisting of: an oxide or nitride of silicon, aluminum, titanium, niobium, zirconia, or tantalum; gold; platinum; aluminum; nickel; palladium; and titanium.

The cleavage inducing members 3 may be what can cause selective growth of the nitride compound semiconductor which is stacked in layers so as to compose a laser structure, and may not only be an insulator but also a metal. Moreover, they may be semiconductors of different compositions in accordance with the nitride compound semiconductor crystal to be grown. Moreover, the cleavage inducing members 3 may be modified portions obtained by, e.g. implanting ions into the nitride compound semiconductor crystal layer. For example, if an aluminum gallium nitride ($Al_xGa_yN$: where $x+y=1$, $0 \leq x \leq 1$, $0 \leq y \leq 1$) whose aluminum component differs from that of the nitride compound semiconductor crystal to be stacked is used for the cleavage inducing members 3, a difference in stress occurs at the interfaces because the nitride compound semiconductor crystal and the $Al_xGa_yN$ mask layer have different coefficients of thermal expansion, thus allowing the cleavages in the subsequent steps to progress more easily. It is preferable that the $Al_xGa_yN$ mask layer has a large Al mole fraction. The greater the Al mole fraction of the $Al_xGa_yN$ mask layer is, the greater coefficient of thermal expansion will exist in the c-plane, so that a greater difference in stress can be obtained.

Hereinafter, with reference to FIG. 7(a) to FIG. 7(i), an embodiment of a method for fabricating a semiconductor laser from the wafer 1 on which the semiconductor multilayer structure 40 of FIG. 2(e) is formed will be described.

Figure 7:
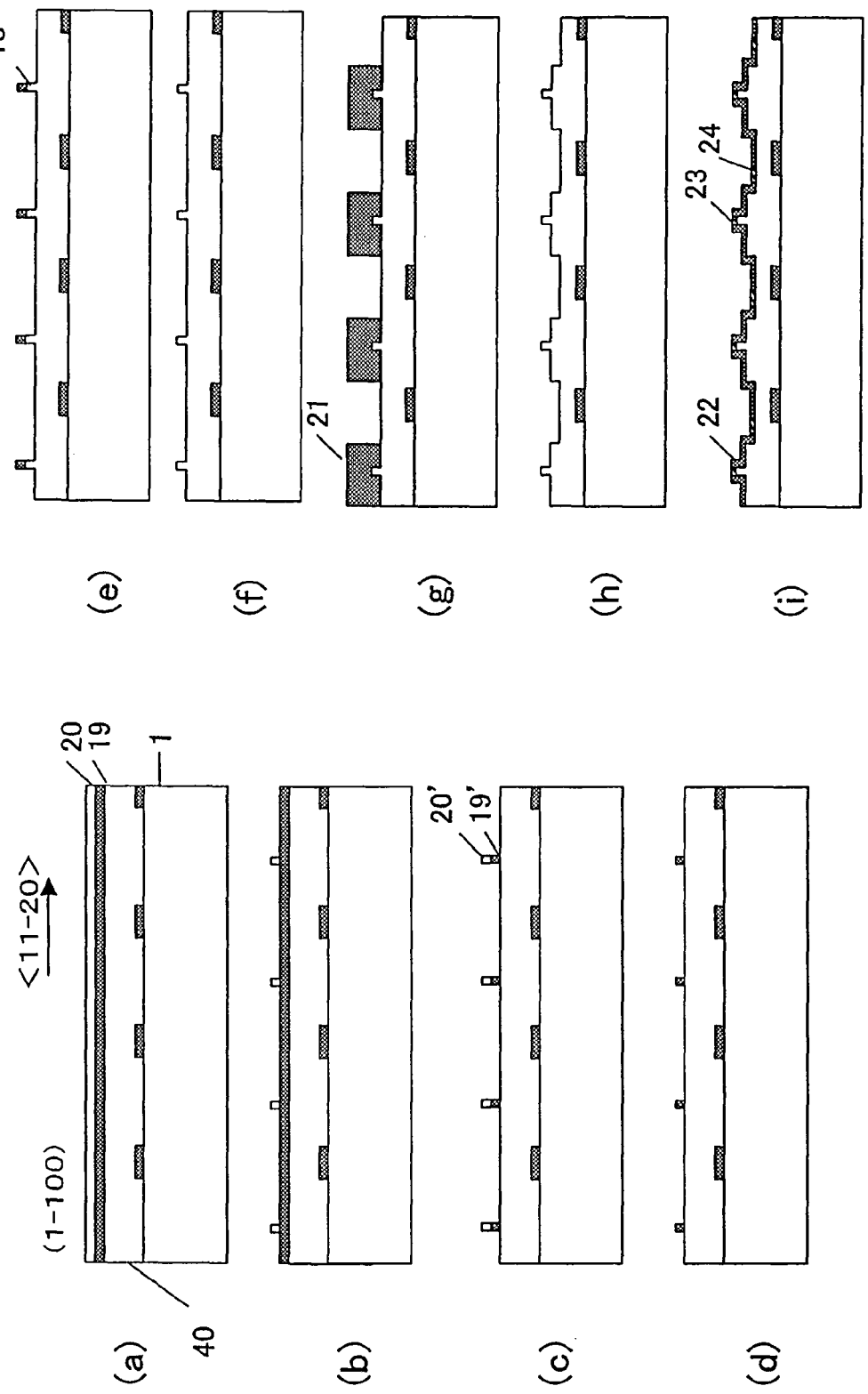
FIG. 7(a) to (i) are step-by-step cross-sectional views showing a process in which a nitride compound semiconductor element according to Embodiment 1 of the present invention is processed.

First, as shown in FIG. 7(a), after an insulating layer 19 is formed on the upper face of the semiconductor multilayer structure 40, a photoresist film 20 is applied thereon. Next, an exposure and development of the photoresist film 20 is performed in a photolithography step, thus forming a resist mask 20' as shown in FIG. 7(b). The resist mask 20' has a stripe pattern defining the optical waveguide forming regions 18' shown in FIG. 4. By using a hydrofluoric acid solution to etch portions of the insulating film 19 that are not covered by the resist mask 20', the upper face (p-type contact layer 17) of the semiconductor multilayer structure 40 is exposed as shown in FIG. 7(c).

After removing the resist mask 20' as shown in FIG. 7(d), as shown in FIG. 7(e), portions of the upper portion of the semiconductor multilayer structure 40 that are not covered by the insulating layer 19' are etched. This can be carried out by loading the wafer 1 into a dry etching apparatus and performing an anisotropic dry etching. Anisotropic etching is to be performed until portions of the p-type semiconductor layer that are positioned above the active layer (leftovers) reach a thickness of about 100 nm.

Thereafter, the insulating layer 19' is removed as shown in FIG. 7(f), whereby ridge-shaped optical waveguides 18 are formed which are composed of the p-type contact layer 17 and the $Al_{0.05}Ga_{0.95}N$ cladding layer 16. The direction in which the optical waveguides 18 extend is <1-100>.

Next, as shown in FIG. 7(g), after regions other than the regions where n-type electrodes are to be formed are covered by an insulative film 21 which is composed of $SiO_2$, a dry etching is performed to expose the n-type contact layer. By removing the insulative film 21, a structure shown in FIG.) 7(h) is obtained.

Next, as shown in FIG. 7(i), after depositing an insulative film 22 for effecting electrical separation between the p-side and the n-side, portions of the insulative film 22 that are positioned on the p-type contact layer are removed with a hydrofluoric acid solution. Thereafter, n-e side electrodes 23 and p-side electrodes 24 are sequentially formed in portions where the insulative film 22 has been removed. Each n-side electrode 23 has a structure in which molybdenum (Mo), platinum (Pt), and gold (Au) are stacked, for example. Each p-side electrode 24 has a structure in which palladium (Pd), Pt, and Au are stacked, for example.

Figure 8:
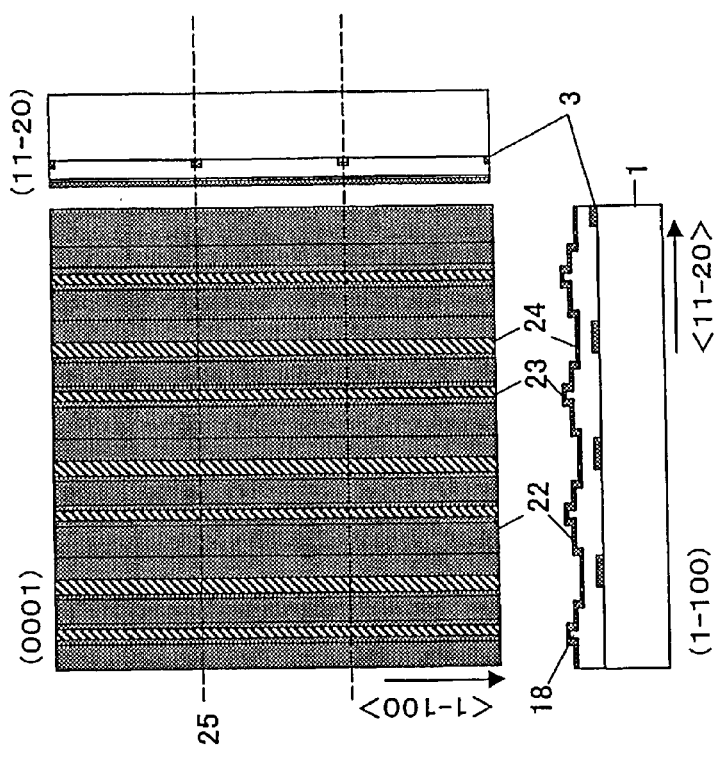
FIG. 8 A schematic diagram showing a method of separation for nitride compound semiconductor elements according to Embodiment 1 of the present invention.
Figure 9:
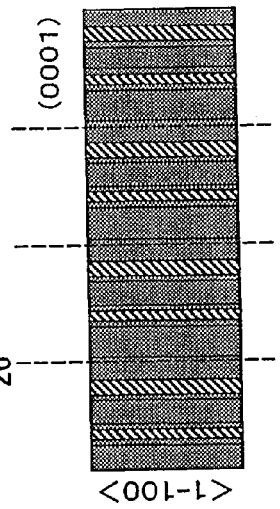
FIG. 9 A plan view showing a laser bar, formed through primary cleavage, according to Embodiment 1 of the present invention.

Hereinafter, with reference to FIG. 8 to FIG. 10, cleavage and packaging steps will be specifically described.

First, the rear face of the GaN wafer 1 is polished, and the overall thickness of the semiconductor multilayer structure 40 and the wafer 1 is reduced to about 100 µm. Next, by using an apparatus which is not shown, stress is applied to effect a primary cleavage along the lines 25 shown in FIG. 8. At this time, the stress occurring at the interfaces between the cleavage inducing members 3 and the nitride compound semiconductor layer is released, so that a cleavage along the cleavage inducing members 3, which are arranged along the <11-20> direction, is induced. As a result, crack occurrence in the 60° direction is suppressed, so that laser bars having smooth resonator end faces of the M-plane (1-100) are fabricated. Thus, according to the present embodiment, the presence of the cleavage inducing members 3 makes it difficult for disruption of the laser bars due to the aforementioned cracks to occur. As a result, it is possible to make long laser bars, reduce the production cost, and improve the yield.

Figure 10:
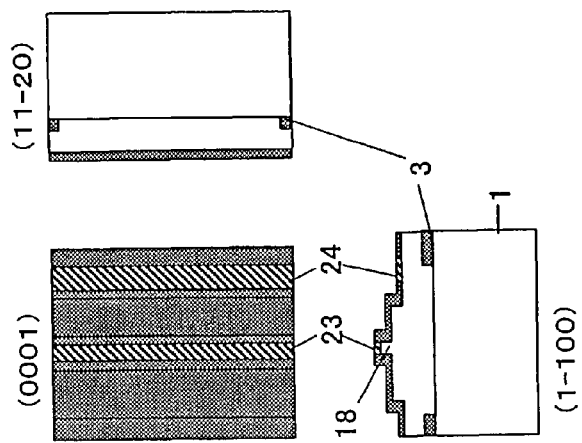
FIG. 10 A schematic diagram showing a nitride compound semiconductor element, after secondary cleavage, according to Embodiment 1 of the present invention.

Next, after a multilayered dielectric film composed of $SiO_x$ and $TiO_x$ is formed on both or either one of the resonator end faces of each laser bar (FIG. 9) obtained through the primary cleavage, a secondary cleavage is performed along the lines 26, whereby laser chips (individual semiconductor lasers) shown in FIG. 10 are separated from each laser bar. Each semiconductor laser includes as its substrate a chip which has been split from the GaN wafer 1.

Next, via solder, each semiconductor laser is placed in such a manner that its p-side portion is in contact with the upper face of a heat sink 28 which is composed of silicon carbide (SiC), and wiring is performed via wire bonding. At this time, by taking advantage of the cleavage inducing members 3 being in specific positions of the laser device, the cleavage inducing members 3 can exhibit a function as positioning markers during the packaging step.

Figure 11:
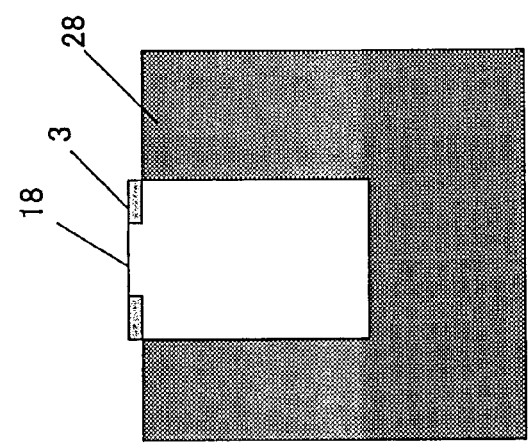
FIG. 11 An upper plan view showing a manner in which the nitride compound semiconductor element according to Embodiment 1 of the present invention is packaged.

As shown in FIG. 11, it is preferable to perform soldering in such a manner that the laser device protrudes from the upper face of the heat sink 28 in the <1-100> direction. In the example shown in FIG. 11, the cleavage inducing members 3 which are located at the optical output end face stick out from the heat sink 28 in the lateral direction. With such location, solder becomes unlikely to adhere to the light-outgoing surface, and contamination of the optical output end faces is suppressed, whereby the packaging yield is improved.

The laser device which has been produced by the above method has smooth resonator surfaces. At room temperature, continuous oscillation was confirmed at an operating current of 60 mA, with a threshold current of 30 mA and an output power of 50 mW, and a lifespan of 1000 hours or more was exhibited.

Moreover, in the laser device of the present embodiment, since tensile stress is released near the cleavage inducing members 3, a "window structure region" which has a relatively large band gap and in which light absorption is suppressed is formed near the resonator end faces. As a result, light emission at a high output power becomes possible. Note that, as the distance between each cleavage inducing member 3 and the ridge becomes shorter, the stress releasing effects will be enhanced, but the possibility of defects being introduced at the light-outgoing surface will also increase. Therefore, the distance between each cleavage inducing member 3 and the ridge stripe is to be set within a range from 2 to 50 µm, e.g. about 5 µm.

Although cleavage is also performed along the lines 26 in the above example, the faces other than the resonator end faces do not need to be cleavage planes. Therefore, cutting with laser, etc., may be performed along the lines 26.

Comparative Example

Figure 12:
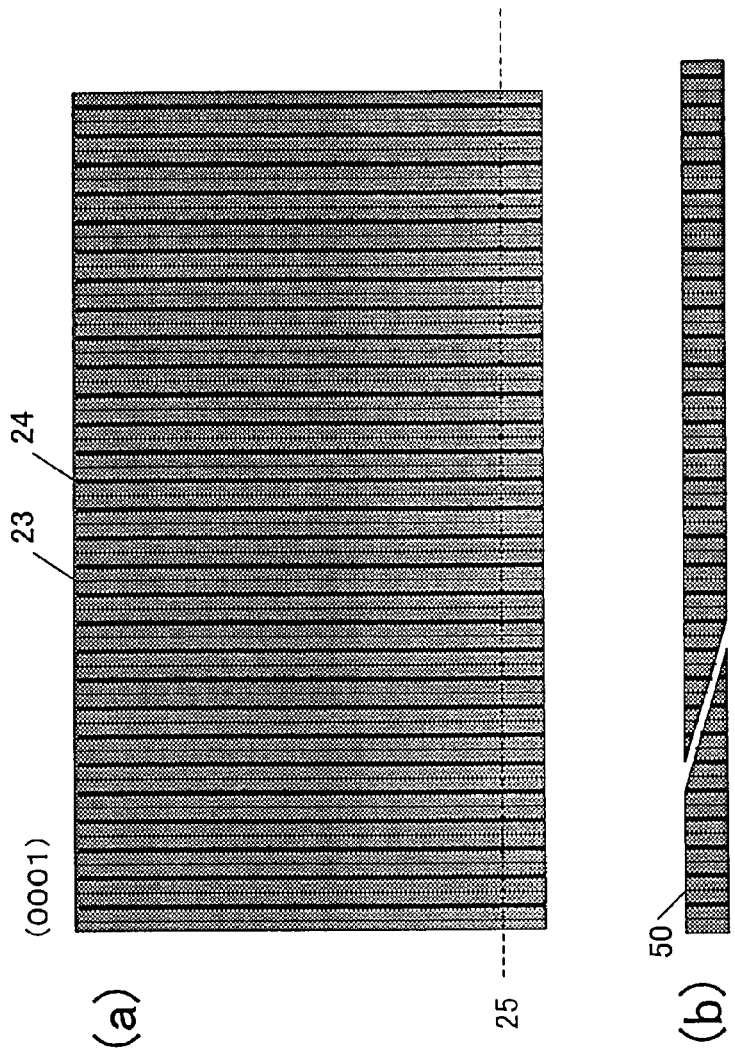
FIGS. 12(a) and (b) are schematic diagrams showing a primary cleavage of a nitride compound semiconductor element according to a comparative example against Embodiment 1 of the present invention.

FIGS. 12(a) and (b) show an experimental result where a primary cleavage is performed for a wafer which has been fabricated as a comparative example. This comparative example has been fabricated by the same method as the method described with respect to Embodiment 1 except that the cleavage inducing members 3 are not formed.

FIG. 12(a) shows an upper face of the wafer of the comparative example. When a primary cleavage was performed in the direction of a line 25 in the figure by using a cleavage apparatus, a crack occurred in the 60° direction with respect to the M-plane, and the laser bar 50 was disrupted part of the way, as shown in FIG. 12(b). As a result, only a laser bar 50 which is about ⅕ in length relative to the bar of Embodiment 1 was obtained, thus resulting in a very low yield. Moreover, the optical output end faces formed through primary cleavage are not flat, and therefore the operating current is high and the lifespan is short.

Embodiment 2

Next, with reference to FIG. 13(a) to FIG. 13(i), a second embodiment of the nitride compound semiconductor laser according to the present invention will be described.

Figure 13:
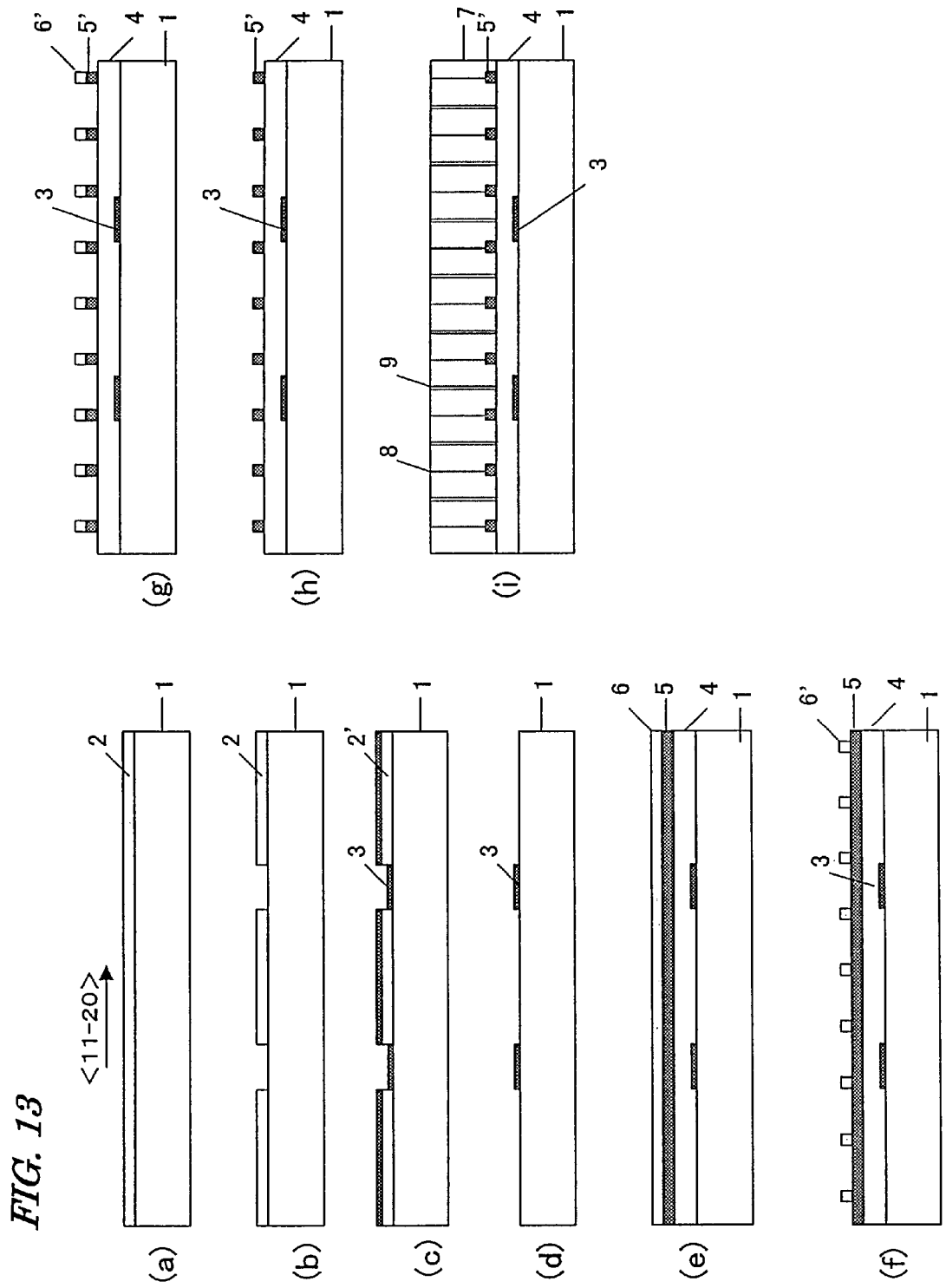
FIG. 13(a) to (i) are step-by-step cross-sectional views showing a production method according to Embodiment 2 of the present invention.

First, as shown in FIG. 13(a), a GaN wafer 1 whose upper face is the (0001) plane is provided, and a photoresist film 2 is applied on the upper face of the GaN wafer 1. The cross section of the GaN wafer 1 that is shown in FIG. 13(a) to FIG. 13(i) is the M(1-100) plane, which will be exposed through primary cleavage. The <11-20> direction lies in the plane of the figure, and is parallel to the upper face (0001) of the GaN wafer 1.

By subjecting the photoresist film 2 to exposure and development through a known photolithography step, the photoresist film 2 is patterned as shown in FIG. 13(b). The patterned photoresist film 2 has a plurality of openings 2' which are periodically arranged in a two-dimensional manner. The shapes, sizes, and positions of the openings 2' can be arbitrarily set by changing the design of a photomask which is used for the exposure in a photolithography step. In the present embodiment, the location of the openings 2' is determined so as to define the arrangement of the cleavage inducing members 3 shown in FIG. 4.

Next, as shown in FIG. 13(c), a silicon dioxide film 3' is deposited on the photoresist mask 2. Although the silicon dioxide film 3' is mostly positioned on the photoresist mask 2, some portions thereof are in contact with the upper face of the GaN wafer 1 through the openings 2'. Deposition of the silicon dioxide film 3' may be performed by an ECR sputtering technique, for example.

Thereafter, a lift-off is performed by removing the photoresist film 2 with an organic solution such as acetone, thus forming the cleavage inducing member 3 as shown in FIG. 13(d).

Next, after a GaN layer 4 is grown on the GaN wafer 1 having the plurality of cleavage inducing members 3 arranged on its upper face, the GaN wafer 1 is taken out of the reactor, and an insulative film 5 for selective growth is formed above the GaN layer 4. The insulative film 5 in the present embodiment is formed of $SiO_2$, with a thickness of about 100 nm, that has been deposited in a plasma CVD apparatus.

Next, after the resist film 6 is applied on the insulative film 5 in a photolithography step, exposure and development is performed to form a resist film 6' which is patterned in stripes, as shown in FIG. 13(f). The resist film 6' is patterned so that each stripe has a width of 3 µm, with an arraying pitch of 18 µm. The stripes extend in a direction which is parallel to the <1-100> direction of the GaN wafer 1.

Next, by using the resist film 6' as an etching mask, the exposed portions of the insulative film 5 are removed with a hydrofluoric acid solution, thus forming a stripe-shaped insulation mask 5' as shown in FIG. 13(g). Thereafter, as shown in FIG. 13(h), the resist film 6' is removed with an organic solution such as acetone.

Next, in order to selectively grow a GaN layer 7, the substrate having the stripe-shaped insulative film 5' deposited thereon is again retained on a susceptor in a reactor of MOVPE equipment. Then the temperature is elevated to about 1000° C. in a hydrogen atmosphere at a pressure of 200 Torr, and by using 7 sccm TMG and 7.5 slm $NH_3$ gas and simultaneously supplying a carrier gas of hydrogen, the GaN layer 7 is selectively grown on the selective growth mask pattern, as shown in FIG. 13(i).

The exposed portions of the GaN layer 4 function as seeds 9 of crystal growth. The dislocation density of the seeds 9 is equal to the dislocation density of the GaN wafer 1, and is about $1\times10^6/cm^3$. However, the dislocation density in the laterally-grown crystal region (wings) of the GaN layer 7 is reduced to about $1\times10^5/cm^3$.

Thereafter, by performing steps similar to the steps described with respect to Embodiment 1, the semiconductor laser of the present embodiment is fabricated. In the present embodiment, since the direction in which the optical waveguides 18 extend is made parallel to the direction in which the stripe-shaped insulative film 5' extends, the optical waveguides 18 are formed in the selective growth regions having a reduced dislocation density, so as to avoid the seeds 8 and the crystal coupling portions 9 having a high dislocation density. As a result, the operating current is reduced and the lifespan is extended.

According to the present embodiment, in addition to the effects of Embodiment 1, an effect of reducing the dislocation density in the selectively-grown layer is obtained, whereby the lifespan of the laser device is improved to 2000 hours or more.

Embodiment 3

Hereinafter, a third embodiment of the nitride compound semiconductor laser according to the present invention will be described.

In the present embodiment, on the GaN wafer 1 before a nitride compound semiconductor crystal is grown thereon, trenches are periodically formed so as to be perpendicular to but not intersecting the optical waveguides, and mask layers (cleavage inducing members 3) are formed on the trenches.

Figure 14:
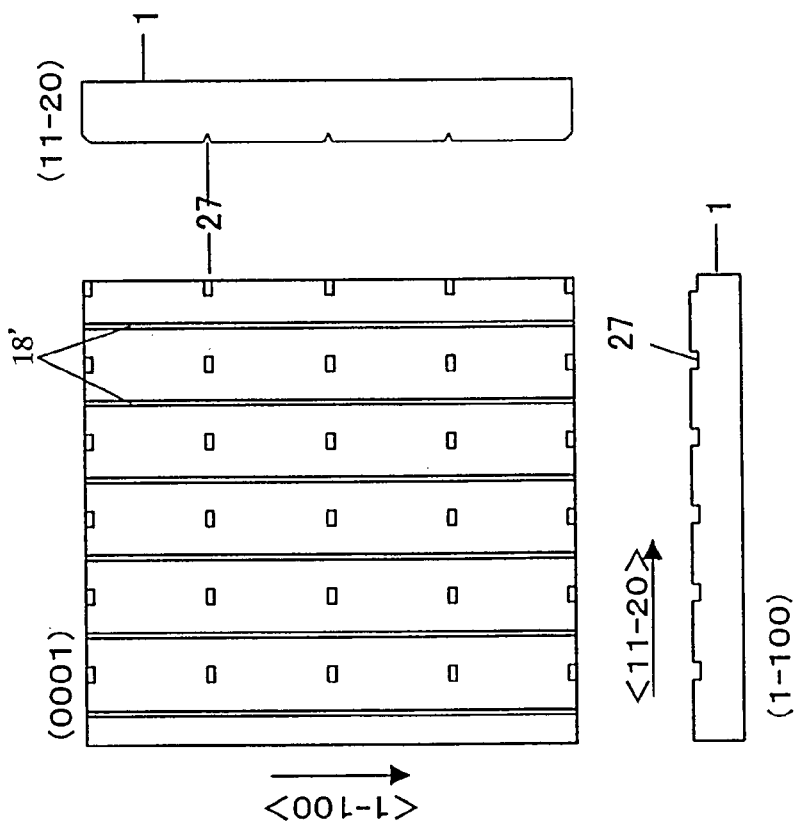
FIG. 14 A view showing the construction of a GaN wafer 1 according to Embodiment 3 of the present invention.

First, a resist film is deposited on the GaN wafer 1 whose principal face is the (0001) plane. By using a photolithography technique, the resist is removed in the form of dotted lines with an interval of about 400 μm, along the <11-20> direction of a subsequently-formed nitride compound semiconductor layer, so as to be perpendicular to but not intersecting the optical waveguides. By using the resist film as an etching mask, the exposed portions of the GaN wafer are subjected to dry etching by using a dry etching apparatus, and an array of a plurality of trenches 27 are formed on the upper face of the GaN wafer 1 as shown in FIG. 14. Each trench 27 is sized about 2 μm (longitudinal)×10 μm (lateral), with a depth of about 2 μm, and they are preferably formed in positions for not unfavorably affecting the neighborhood of the subsequently-formed optical waveguides, e.g., crystal strain. The trenches 27 have a V-shape in any cross section parallel to the (11-20) plane. It is preferable that the trenches 27 have a long extent along the <11-20> direction, and form an apex of an acute angle at its both ends.

Figure 15:
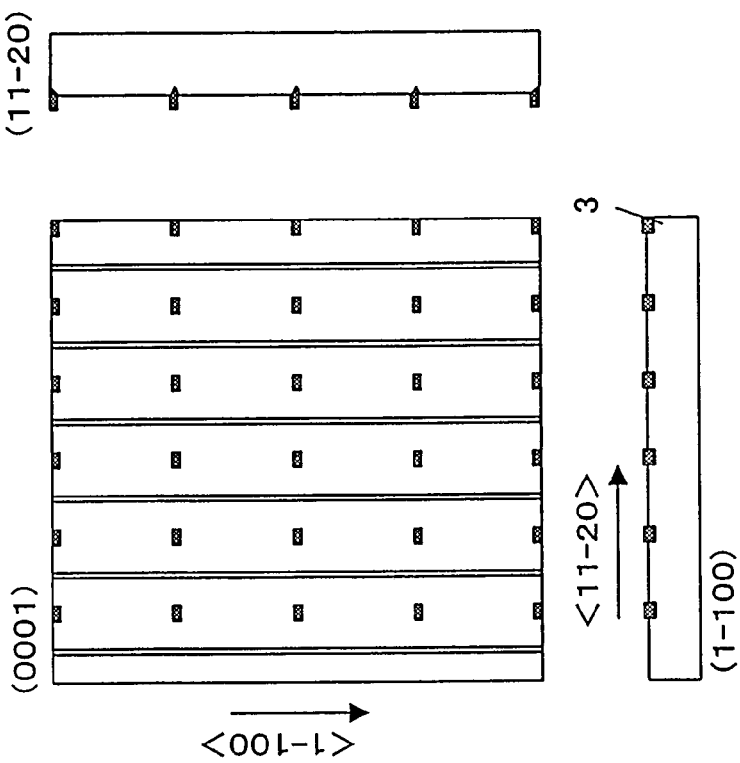
FIG. 15 A view showing the construction of the GaN wafer 1 according to Embodiment 3 of the present invention.

Next, as shown in FIG. 15, cleavage inducing members 3 are formed in the trenches 27. The method for forming the cleavage inducing members 3 is similar to the method described with respect to Embodiment 1. However in the present embodiment, it is preferable to carry out a high-precision mask alignment so as to match the positions of the cleavage inducing members 3 with the positions of the trenches 27. However again, there may be some offset between the cleavage inducing members 3 and the trenches 27.

The subsequent steps are similar to the steps described with respect to Embodiment 1, and the description thereof will not be repeated herein.

In the present embodiment, the trenches 27 are formed immediately under the cleavage inducing members 3, so that cleavage is more likely to be induced, and it is even easier to form smooth resonator end faces.

Embodiment 4

Hereinafter, a fourth embodiment of the nitride compound semiconductor laser according to the present invention will be described.

Figure 16:
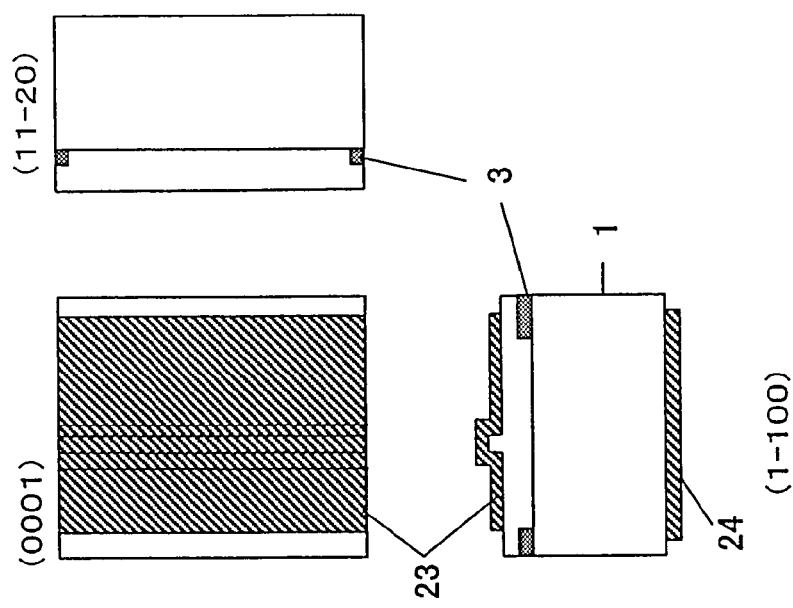
FIG. 16 A view showing a nitride compound semiconductor element according to Embodiment 4 of the present invention.

In the present embodiment, as shown in FIG. 16, an n-type GaN wafer 1 is used and an n-type electrode 24 is formed on its rear face. In the present embodiment, after the optical waveguide 18 is formed, polishing is performed from the rear face of the GaN wafer 1 so as to attain an overall thickness of about 70 μm. According to the conventional cleavage method, the mechanically fragile substrate has been prone to destruction when scribing and dicing are used, thus resulting in a low yield; therefore, it has been necessary to leave a substrate thickness of about 100 μm in the polishing step. However, in the present embodiment, the substrate thickness can be made further thinner because scribing and dicing, etc., are not used. A thinner substrate leads to an increased heat radiation efficiency of the entire laser device, so that an effect of increasing the laser device's lifespan is expected.

Since an electrically conductive n-type GaN wafer 1 is used in the present embodiment, it is possible to form the n-side electrodes 24 directly on the rear face of the GaN wafer 1, as shown in FIG. 16.

Note that, if the n-side electrodes 24 are patterned so as to avoid the regions where primary cleavage and secondary cleavage are to occur, peeling of the n-side electrodes 24 during cleavage can be prevented. However, the n-side electrodes 24 may be formed over the entire rear face of the n-type GaN wafer 1.

In the present embodiment, since electrodes are formed on the rear face of the GaN wafer 1, it is possible to reduce the size of the laser device, and the laser device can be produced at a low cost.

Example

The shape and size of cleavage inducing members were changed in various manners, and soundness of cleavage was evaluated. Hereinafter, a production method for the samples used in the Example will be described.

First, a GaN wafer having a thickness of 400 μm was provided, and cleavage inducing members composed of an insulative film were formed on its principal face. Specifically, after cleaning the GaN wafer with acetone, solfine, methanol, and buffered hydrofluoric acid (BHF), an SiN layer (lower layer) and an $SiO_2$ layer (upper layer) were sequentially deposited by using an ECR sputtering apparatus. The thicknesses of the $SiO_2$ layer and the SiN layer were respectively set at 10 nm and 100 nm, or 10 nm and 500 nm.

Next, this multilayer was patterned by a photolithography technique and an etching technique. Etching of the SiN layer and the $SiO_2$ layer was performed through a dry etching using $CF_4$ (carbon tetrafluoride) gas. Thereafter, cleaning (acetone+sulfuric acid/hydrogen peroxide) was performed to form cleavage inducing members of a desired shape. The cleavage inducing members in the present Example function as mask layers for the selective growth in an epitaxial growth step to be next performed. Hereinafter, the cleavage inducing members in the present Example will be referred to as "mask layers".

Figure 17:
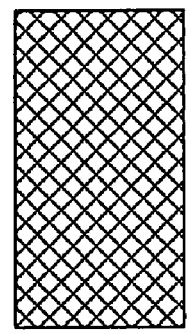
FIGS. 17(a), (b) and (c) are plan views showing mask layers (cleavage inducing members) of different shapes.
Figure 17:
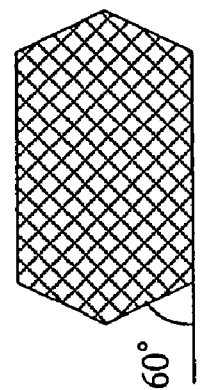
Figure 17:
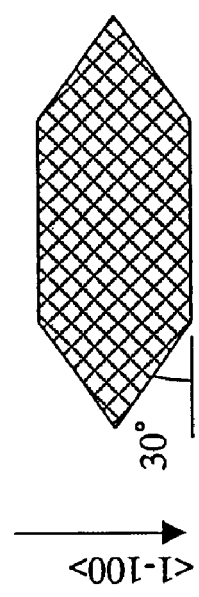

FIGS. 17(a) to (c) each shows a planar shape of a mask layer formed in the present Example. FIGS. 17(a) and (b) show mask layers of a hexagonal planar shape, placed in a linear arrangement along the <11-20> direction. The angle between the <11-20> direction and a side having a vertex pointed in the <11-20> direction at one end thereof is set at 30 degrees in the example of FIG. 17(a), and 60 degrees in the example of FIG. 17(b). FIG. 17(c) shows a mask layer having a rectangular planar shape, linearly arranged along the 1-20> direction.

In each of the mask layers shown in FIGS. 17(a) and (c), the side which is parallel to the <11-20> direction is relatively longer than the other sides.

Table 1 shows sizes for mask layers having the shape shown in FIG. 17(a) (sample Nos. 1 to 6). Table 2 shows sizes for mask layers having the shape shown in FIG. 17(b) (sample Nos. 7 to 12). Table 3 shows sizes for mask layers having the shape shown in FIG. 17(c) (sample Nos. 13 to 24). For each sample, the thickness of the mask layers was set to either 100 nm or 500 nm, as mentioned earlier.

TABLE 1

Hexagonal (30 deg)

| No. | <11-20> [µm] × <1-100> [µm] | results |
|---|---|---|
| 1 | 10 × 5 [µm] | ○ |
| 2 | 50 × 5 | ○ |
| 3 | 50 × 10 | ○ |
| 4 | 180 × 5 | ○ |
| 5 | 180 × 10 | ○ |
| 6 | 180 × 50 | ○ |

TABLE 2

Hexagonal (60 deg)

| No. | <11-20> [µm] × <1-100> [µm] | results |
|---|---|---|
| 7 | 10 × 5 | ○ |
| 8 | 50 × 5 | ○ |
| 9 | 50 × 10 | ○ |
| 10 | 180 × 5 | ○ |
| 11 | 180 × 10 | ○ |
| 12 | 180 × 50 | ○ |

TABLE 3

Rectangular

| No. | <11-20> [µm] × <1-100> [µm] | results |
|---|---|---|
| 13 | 3 × 5 | X |
| 14 | 3 × 10 | X |
| 15 | 5 × 5 | X |
| 16 | 10 × 5 | ○ |
| 17 | 10 × 10 | ○ |
| 18 | 10 × 50 | ○ |
| 19 | 50 × 5 | ○ |
| 20 | 50 × 10 | ○ |
| 21 | 50 × 50 | ○ |
| 22 | 180 × 5 | ○ |
| 23 | 180 × 10 | ○ |
| 24 | 180 × 50 | X |

Note that each table shows the size along the <11-20> direction and the size along the <1-100> direction of each mask layer. For example, in sample No. 6 shown in Table 1, the mask layers have a size of 180 µm along the <11-20> direction and a size of 50 µm along the <1-100> direction.

In the present Example, a large number of mask layers having the aforementioned shapes and sizes were arranged on a wafer with a pitch of 400 µm. The number of mask layers arranged along a single line was thirty.

Next, selective epitaxial growth of a nitride compound semiconductor was performed by an MOVPE technique. Specifically, the wafer was cleaned with BHF, and SiO$_2$ on the mask layers was subjected to wet etching to allow a clean SiN mask surface to be exposed. Thereafter, semiconductor multilayer structure having a double-hetero structure was formed in an MOVPE reactor. The growth conditions were similar to the conditions of the growth performed when forming the semiconductor multilayer structure 40 shown in FIG. 2(e).

In the present Example, the surface of the mask layers was composed of SiN, and hardly any semiconductor layer grew on this surface. However, in the case of mask layers having a size of 5 µm or less, the upper face of the mask layers was almost covered by the semiconductor layer due to lateral growth. The thickness of the semiconductor multilayer structure covering the mask layers was not uniform, and depressions were formed on the upper face due to the presence of the mask layers.

The wafer having the semiconductor multilayer structure thus formed on its principal face was polished from the rear face, and the wafer thickness was adjusted to about 100 µm. Thereafter, cleavage was performed via edge scribing and breaking, and the soundness of cleavage was evaluated.

The rightmost column in Table 1 to Table 3 show evaluation results of sample Nos. 1 to 24. In the "results" column of each table, the "○" symbol indicates that 12 mm-long bars were appropriately fabricated through cleavage. On the other hand, the "X" symbol indicates that the cleavage planes deviated from the mask layer rows, so that 12 mm-long bars could not be appropriately fabricated.

Figure 18:
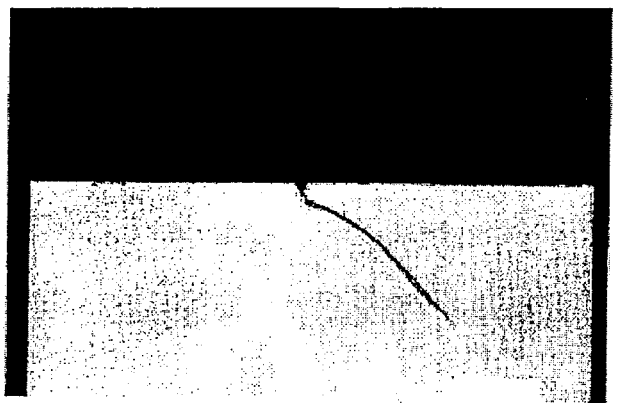
FIG. 18 An optical micrograph of a cleavage plane in which an end-face crack is formed.

In Samples 13 to 15 of Table 3, cleavage was not appropriately performed. The reason is that the mask layer size was too small. FIG. 18 is an optical micrograph showing a cross section of a sample whose mask layers had a small planar size, resulting in a cleavage plane deviating from a mask layer row. As can be seen from FIG. 18, an end-face crack is formed at the cleavage plane. However, even if the mask layer size is small, appropriate cleavage was realized in the case where mask layers of a hexagonal shape was used as shown in Table 1 and Table 2.

In the case where the mask layers had a rectangular shape, as shown in Table 3, cleavage was not properly performed when the size along the <1-100> direction was as large as 50 µm or more.

As can be seen from the above results, it is preferable that the mask layers are shaped so as to have a vertex pointing in a direction parallel to a cleavage plane. In the case of employing mask layers of a shape having no such vertices (e.g., rectangle or square), it is preferable to set their size to be within an appropriate range.

Figure 19:
FIG. 19 An optical micrograph showing a cross section of a sample in which a thick epitaxially-grown layer is formed in a region near the mask layer.

FIG. 19 is an optical micrograph showing a cross section of a sample whose mask layers have such a large planar size that the epitaxial layer near the mask layers has acquired a non-uniform thickness. If the mask layers become too large, strain and the like may occur in the semiconductor multilayer structure. Therefore, the mask layers are preferably formed so as to be smaller than 180 µm×50 µm in size, and desirably smaller than 10 m µm×30 µm in size. Moreover, the thickness of the mask layers may be set to an arbitrary value of 1.0 µm or less, for example. Note that the mask layer(s) which remains in at least some of the four corner s of the chip after cleavage will typically have a size which is about half the aforementioned size.

Figure 20:
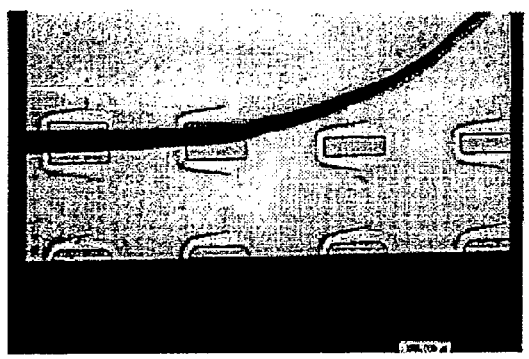
FIG. 20 An optical micrograph showing a cleavage which has deviated from a row of mask layers of a rectangular shape.

FIG. 20 is an optical micrograph showing the principal face, after cleavage, of a substrate of a sample on which mask layers of a relatively large size are formed. While the cleavage plane was deviated from the mask layer row where the mask layers had a rectangular planar shape, appropriate cleavage occurred where the mask layers had a hexagonal planar shape.

As has been described above, according to the present invention, cleavage inducing members are arranged in intermittent and linear manners on a wafer, whereby cleavage can be performed with a good yield.

Figure 21:
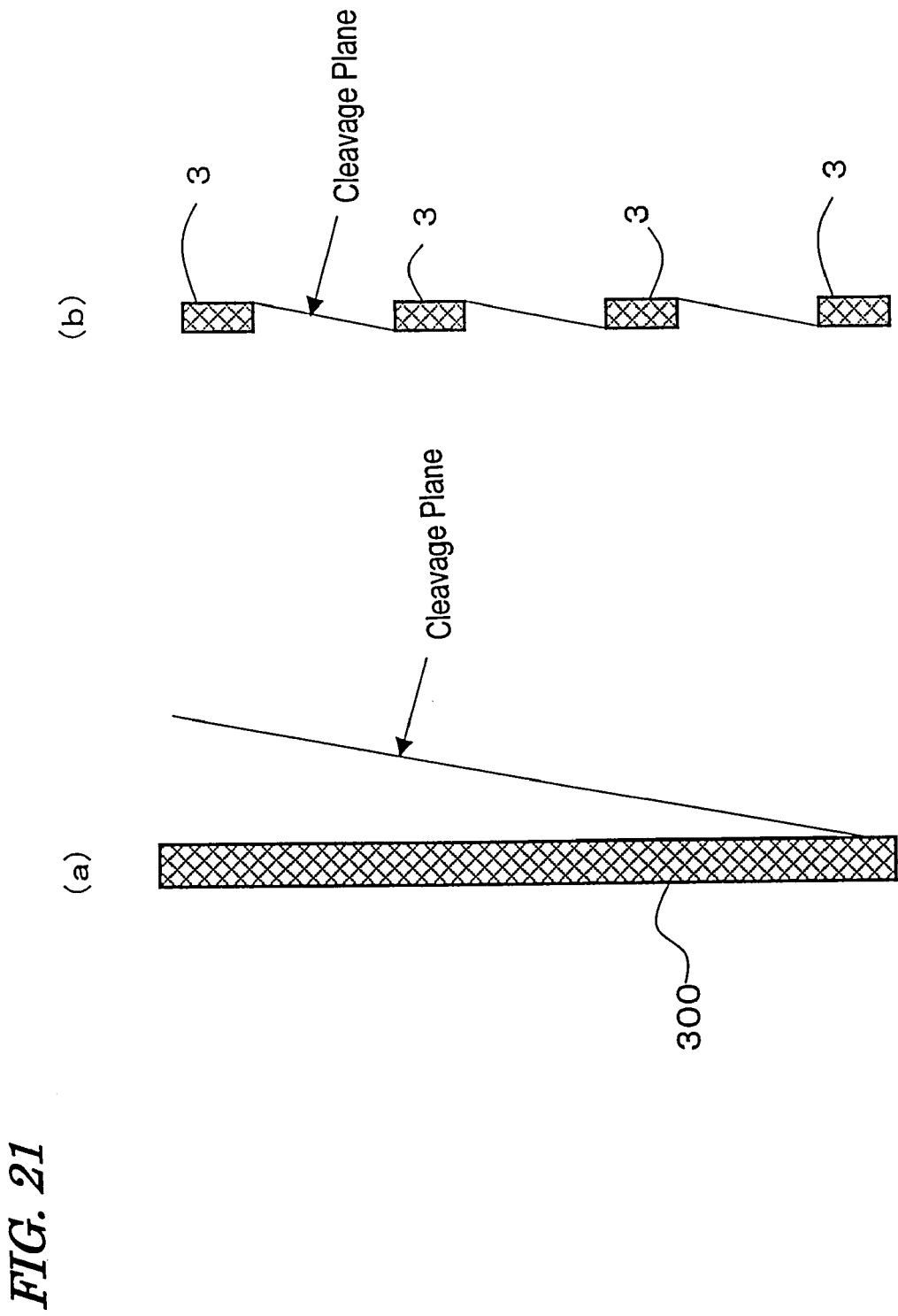
FIG. 21(a) is a plan view schematically showing a cleavage in the case where the easily-cleavable direction of a crystal has deviated from a cleavage inducing member extending in the form of a stripe; and (b) is a plan view schematically showing a cleavage where the easily-cleavable direction of a crystal has deviated from a direction in which the cleavage inducing members are intermittently arranged.

As shown in FIG. 21(a), in the case where a trench 300, etc., that extends long and continuously on a plane at which cleavage is to occur is formed on a wafer, the cleavage plane will deviate significantly from the direction in which the trench extends if the direction in which the trench extends deviates even slightly from the easily-cleavage plane of the crystal, thus detracting from the purpose of providing the cleavage inducing members. On the other hand, in the case where the cleavage inducing members 3 are arranged in an intermittent manner as shown in FIG. 21(*b*), the cleavage plane is prevented from deviating significantly from the direction along which the cleavage inducing members are arranged, even if there is a discrepancy between the direction of their arrangement and the easily-cleavable direction.

Note that, by removing the mask layers through etching after finishing the epitaxial growth step, gaps may be formed in the portions where the mask layers existed. When cleavage is performed after such an etching, the gaps will function as cleavage inducing members.

INDUSTRIAL APPLICABILITY

As lasers for short-wavelength light sources employing GaN substrates which are difficult to be cleaved, mass production of nitride compound semiconductor lasers according to the present invention is expected.

The invention claimed is:

1. A nitride compound semiconductor element including a substrate having an upper face and a lower face and a semiconductor multilayer structure supported by the upper face of the substrate, such that the substrate and the semiconductor multilayer structure have at least two cleavage planes, comprising:
  at least one cleavage inducing member whose planar shape is a quadrangle having one angle not equal to 90°, the at least one cleavage inducing member in contact with one of the at least two cleavage planes wherein a length of the at least one cleavage inducing member along a direction parallel to the one of the at least two cleavage planes is smaller than a length of the upper face of the substrate along the direction parallel to the one of the at least two cleavage planes, and wherein the at least one cleavage inducing member is composed of a mask layer formed on the upper face of the substrate or in the semiconductor multilayer structure,
  wherein the upper face of the substrate has a rectangular shape, and the at least one cleavage inducing member is positioned in at least one of four corners of the upper face of the substrate.

2. The nitride compound semiconductor element of claim 1, wherein,
  the semiconductor multilayer structure has a laser resonator structure in which the two cleavage planes function as resonator end faces; and
  a length of the at least one cleavage inducing member along a resonator length direction is half or less of the resonator length.

3. The nitride compound semiconductor element of claim 1, wherein,
  two or more cleavage inducing members are comprised, and arranged along a resonator length direction; and
  an interval between adjoining cleavage inducing members along the resonator length direction is 80% or more of the resonator length.

4. The nitride compound semiconductor element of claim 1, wherein,
  a trench is formed on the upper face of the substrate; and the mask layer is positioned above the trench.

5. The nitride compound semiconductor element of claim 1, wherein the mask layer is composed of a material which suppresses crystal growth of semiconductor layers composing the semiconductor multilayer structure.

6. The nitride compound semiconductor element of claim 1, wherein the mask layer is formed of at least one material selected from the group consisting of: an oxide or nitride of silicon, aluminum, titanium, niobium, zirconium, or tantalum; gold; platinum; aluminum; nickel; palladium; and titanium.

7. The nitride compound semiconductor element of claim 2, wherein the at least one cleavage inducing member is located on both sides of a laser optical waveguide portion in the semiconductor multilayer structure.

8. The nitride compound semiconductor element of claim 1, wherein the semiconductor multilayer structure includes: an n-type nitride compound semiconductor layer and a p-type nitride compound semiconductor layer; and an active layer interposed between the n-type nitride compound semiconductor layer and the p-type nitride compound semiconductor layer.

9. The nitride compound semiconductor element of claim 1, wherein the substrate is a nitride compound semiconductor.

10. The nitride compound semiconductor element of claim 5, wherein a pair of electrodes are formed on the upper face and the lower face of the substrate.

* * * * *